(12) United States Patent
Lin

(10) Patent No.: US 7,327,568 B2
(45) Date of Patent: Feb. 5, 2008

(54) HEAT SINK ASSEMBLY WITH ROTATABLE FINS

(75) Inventor: Yung Kun Lin, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 468 days.

(21) Appl. No.: 11/105,353

(22) Filed: Apr. 14, 2005

(65) Prior Publication Data

US 2005/0248918 A1     Nov. 10, 2005

(30) Foreign Application Priority Data

May 10, 2004   (TW)   ................................ 93113102 A

(51) Int. Cl.
*H05K 5/00*    (2006.01)
*H05K 7/20*    (2006.01)
*F28F 7/00*    (2006.01)

(52) U.S. Cl. ........................ 361/697; 361/687; 361/690; 361/694; 361/695; 165/80.2; 165/80.3

(58) Field of Classification Search ........ 361/687–690, 361/694–697, 701–703; 257/706, 712, 721, 257/722; 174/16.1, 16.3; 165/80.2, 80.3
See application file for complete search history.

(56) References Cited

U.S. PATENT DOCUMENTS

| 4,901,369 A | * | 2/1990 | Momose et al. ............... 455/84 |
| 5,923,179 A | * | 7/1999 | Taylor ......................... 324/755 |
| 6,447,322 B1 | * | 9/2002 | Yan et al. .................... 439/331 |
| 6,752,645 B2 | * | 6/2004 | Nakamura et al. .......... 439/330 |
| 6,942,506 B2 | * | 9/2005 | Kimura et al. .............. 439/159 |
| 7,036,574 B2 | * | 5/2006 | Thompson et al. ......... 165/185 |
| 2003/0032322 A1 | * | 2/2003 | Nakamura et al. .......... 439/330 |
| 2005/0074995 A1 | * | 4/2005 | Kimura et al. .............. 439/159 |

* cited by examiner

*Primary Examiner*—Lisa Lea-Edmonds
*Assistant Examiner*—Anthony M Haughton
(74) *Attorney, Agent, or Firm*—Birch, Stewart, Kolasch & Birch, LLP

(57) ABSTRACT

A heat sink assembly having rotatable fins includes a housing, a first heat dissipating device, a rod, an elastic member and a lever. The housing includes a first sidewall having a first hole, a first sliding hole and a stop portion, and a second sidewall having a second hole and a second sliding hole. The first heat dissipating device is in the housing and has a third hole, a first protrusion sliding in the first sliding hole, and a second protrusion sliding in the second sliding hole. The rod passes through the first, second and third holes. The first heat dissipating device rotates between a first position and a second position with the rod of being a rotating center. A first end of the elastic member connects with the stop portion, and a second end thereof connects with the first protrusion. The lever moves with the second protrusion.

17 Claims, 5 Drawing Sheets

HEAT SINK ASSEMBLY WITH ROTATABLE FINS

BACKGROUND OF THE INVENTION

1. Field of Invention

The invention relates to a heat sink assembly, and more particularly to a heat sink assembly with rotatable fins and an electrical apparatus using the heat sink assembly to enlarge or extend the space for dissipating heat more quickly & more efficacious.

2. Related Art

Notebook computers have been widely used among the current information products because they have the main advantage of good mobility and capable of being portable according to requirements of users. In the highly developed and advanced information technology, a notebook computer may serve as a mobile workstation capable of enabling the network information acquisition and transmission and the database management. So, the notebook computer is the best choice for implementing the mobile office. In addition to the consideration of the software pack, the notebook computer still has to take the human-oriented operations into important considerations, such as the interface connection convenience, weight, and operation convenience.

The components for the notebook computer have to be miniaturized because the notebook computer is emphasized in its miniaturized size and it mobility. As shown in FIG. 1, a heat sink assembly 10 for a notebook computer includes a cartridge 11, a plurality of heat dissipation fins 12, and a fan 13 contained in the cartridge 11. The cartridge 11 has an inlet 111 and an outlet 112, and the heat dissipation fins 12 are disposed at the outlet 112 to dissipate heat. The fan 13 sucks the external cold air via the inlet 111 and hot air generated by the notebook computer is drained via the outlet 112 such that the temperature of the notebook computer can be lowered according to the circulation of the hot and cold air.

However, the heat dissipation fins 12 of the conventional heat sink assembly 10 are disposed at the outlet 112 and cannot be moved or rotated. In addition, the space for the outlet 112 is also limited such that the heat dissipation fins 12 cannot get a larger heat dissipation space and the heat dissipation efficiency of the heat dissipation fins 12 is thus limited. Consequently, the electrical components in the notebook computer tend to be damaged because the environmental temperature is too high and the electrical components are thus overheated, thereby reducing the quality of the notebook computer.

In view of the above-mentioned problems, it is an important subject of the invention to provide a heat sink assembly, which has rotatable fins and can solve the problems that the heat dissipating device cannot be rotated and that the heat dissipation efficiency cannot be increased in the prior art.

SUMMARY OF THE INVENTION

In view of the foregoing, the invention is to provide a heat sink assembly having rotatable fins to increase the heat dissipation efficiency and an electrical apparatus using this heat sink assembly.

To achieve the above, a heat sink assembly with rotatable fins of the invention includes a housing, a first heat dissipating device, a rod, an elastic member and a lever. The housing has a first sidewall and a second sidewall opposite to the first sidewall. The first sidewall has a first hole, a first sliding hole and a stop portion. The second sidewall has a second hole and a second sliding hole. The first heat dissipating device located in the housing has at least one third hole, a first protrusion and a second protrusion. The first protrusion slides in the first sliding hole and the second protrusion slides in the second sliding hole. The first protrusion and the second protrusion cause the first heat dissipating device to rotate between a first position and a second position. The rod passes through the first hole, the second hole and the third hole. The first heat dissipating device rotates between the first position and the second position with the rod as a rotating center. The elastic member has a first end connecting with the stop portion and a second end connecting with the first protrusion, and provides elasticity for the first protrusion to move the first heat dissipating device back to the first position. The lever is pivoted on an external side of the second sidewall, and the lever moves with the second protrusion.

In addition, the invention also discloses an electrical apparatus including a first casing, a second casing and a heat sink assembly. The second casing is pivoted on the first casing and the second casing is opposite to the first casing. The heat sink assembly is contained in the second casing. The heat sink assembly includes a housing, a first heat dissipating device, a rod, an elastic member and a lever. The housing has a first sidewall and a second sidewall opposite to the first sidewall. The first sidewall has a first hole, a first sliding hole and a stop portion. The second sidewall has a second hole and a second sliding hole. The first heat dissipating device located in the housing has at least one third hole, a first protrusion and a second protrusion. The first protrusion slides in the first sliding hole and the second protrusion slides in the second sliding hole. The first protrusion and the second protrusion cause the first heat dissipating device to rotate between a first position and a second position. The rod passes through the first hole, the second hole and the third hole. The first heat dissipating device rotates between the first position and the second position with the rod of being a rotating center. The elastic member has a first end connecting with the stop portion and a second end connecting with the first protrusion, and provides elasticity for the first protrusion to move the first heat dissipating device back to the first position. The lever is pivoted on an external side of the second sidewall, and the lever moves with the second protrusion.

As mentioned above, the heat sink assembly with rotatable fins or the electrical apparatus using this heat sink assembly according to the invention has a rotatable heat dissipating device. Compared to the prior art, the heat sink assembly and the electrical apparatus including the rotatable heat dissipating device can enlarge the heat dissipation space of the heat dissipating device, enhance the heat dissipation efficiency of the heat sink assembly, effectively lower the temperature of the electrical apparatus, prevent the electrical apparatus from being overheated owing to the poor heat dissipation effect, and thus ensure the quality of the electrical apparatus. In addition, the rotatable heat dissipating device of the invention cannot be rotated until the first casing and the second casing are opened. When the electrical apparatus is not used, the first casing and the second casing cover and close each other. In this case, the rotatable heat dissipating device is not exposed from the electrical apparatus, which does not interfere the user's convenience of carrying the electrical apparatus. Furthermore, the rotatable heat dissipating device is free from being collided, and the broken condition of the rotatable heat dissipating device can be avoided.

BRIEF DESCRIPTION OF THE DRAWINGS

The invention will become more fully understood from the detailed description given hereinbelow illustration only, and thus is not limitative of the present invention, and wherein.

DETAILED DESCRIPTION OF THE INVENTION

Other objects, features, and advantages of the invention will become apparent from the following detailed description of the preferred but non-limiting embodiments. The heat sink assembly with rotatable fins and the electrical apparatus with the heat sink assembly according to the embodiment of the invention will be made with reference to the accompanying drawings.

Figure 1:
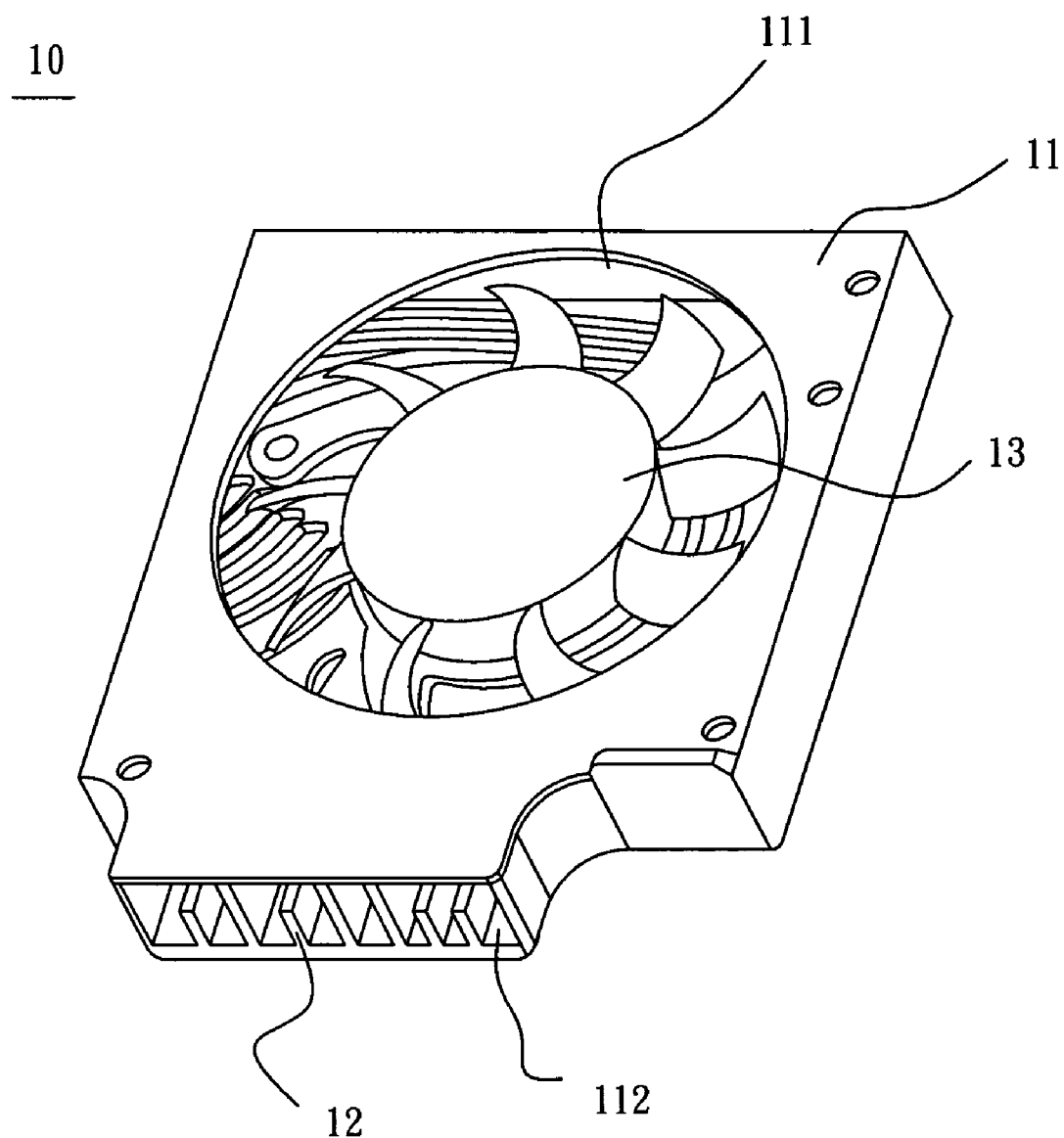
FIG. 1 is a schematic illustration showing a conventional heat sink assembly.
Figure 2:
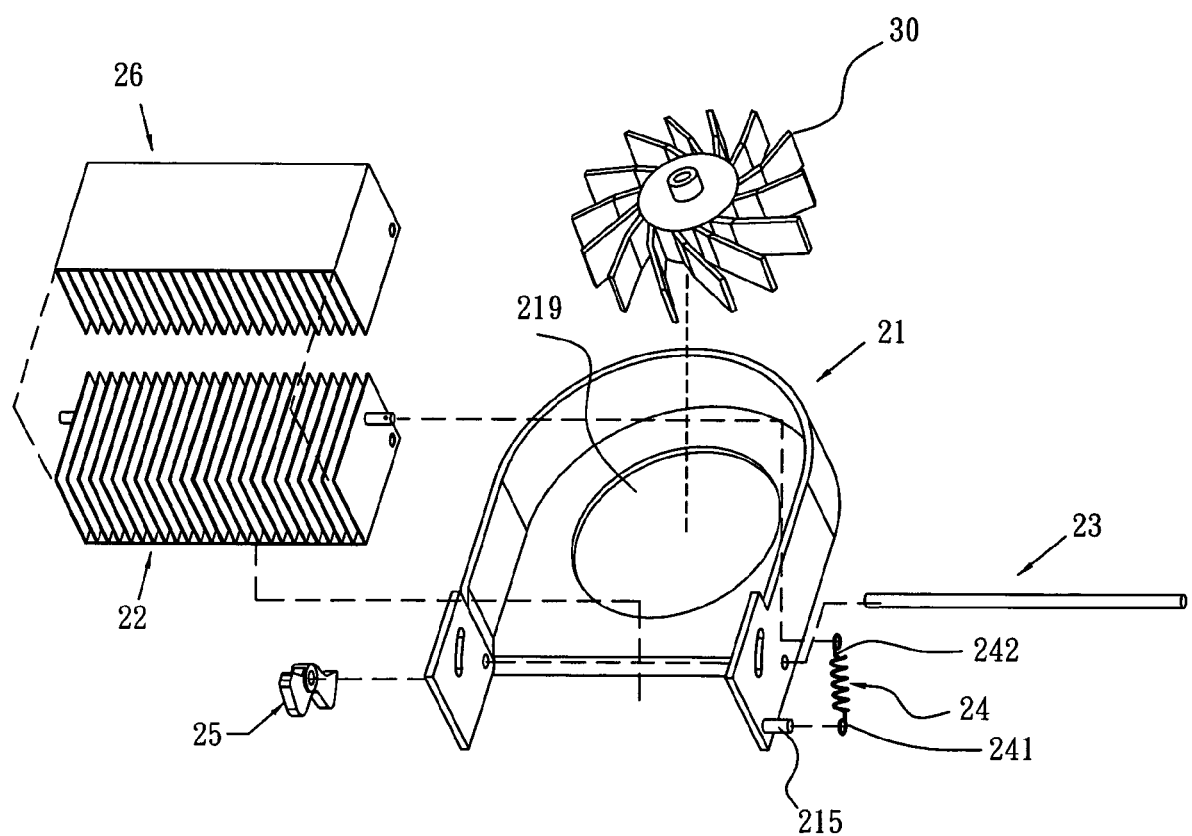
FIG. 2 is a schematic illustration showing a heat sink assembly with rotatable fins according to a preferred embodiment of the invention.
Figure 3:
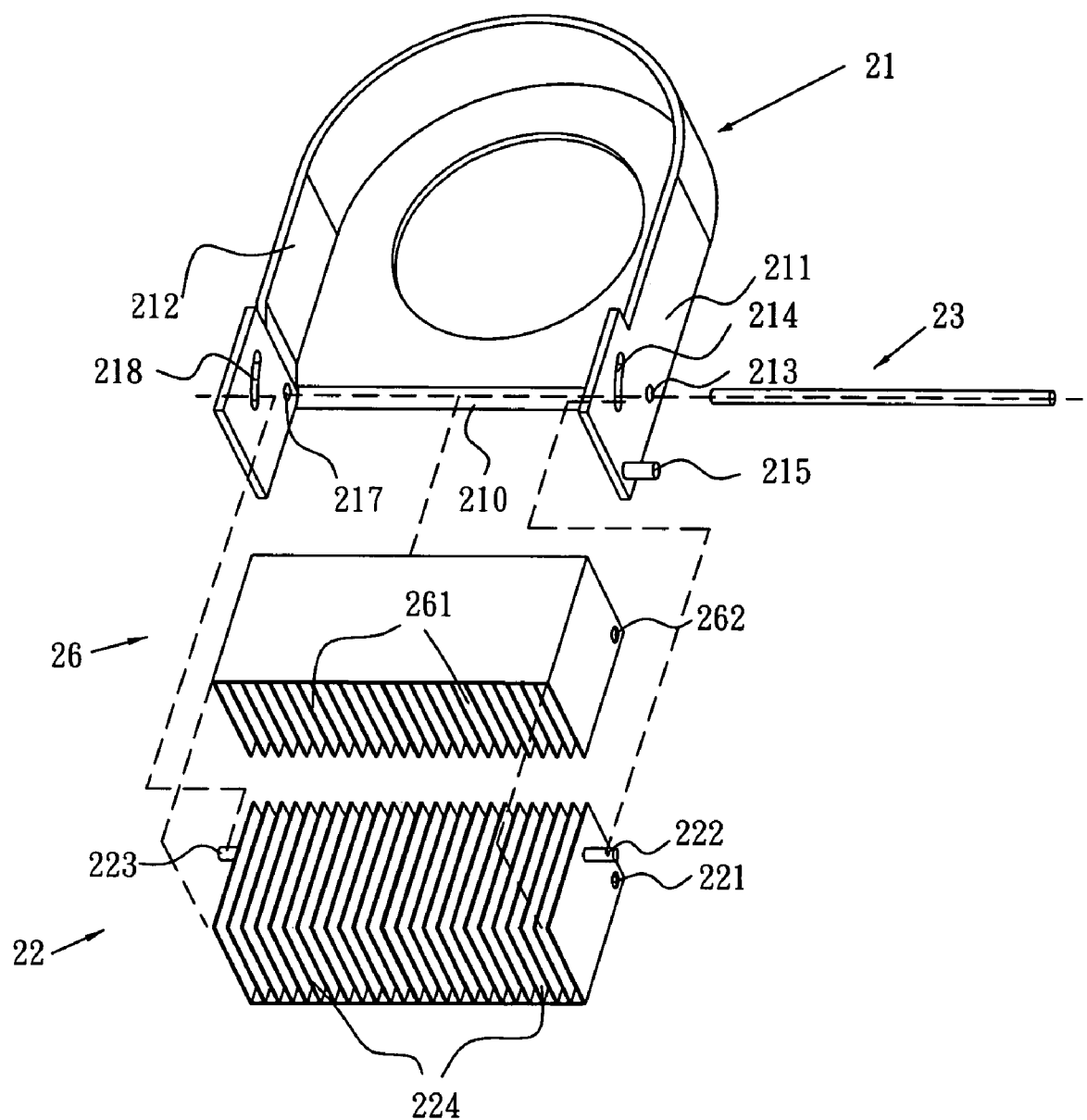
FIG. 3 is a schematic illustration showing another heat sink assembly with rotatable fins according to a preferred embodiment of the invention.
Figure 4:
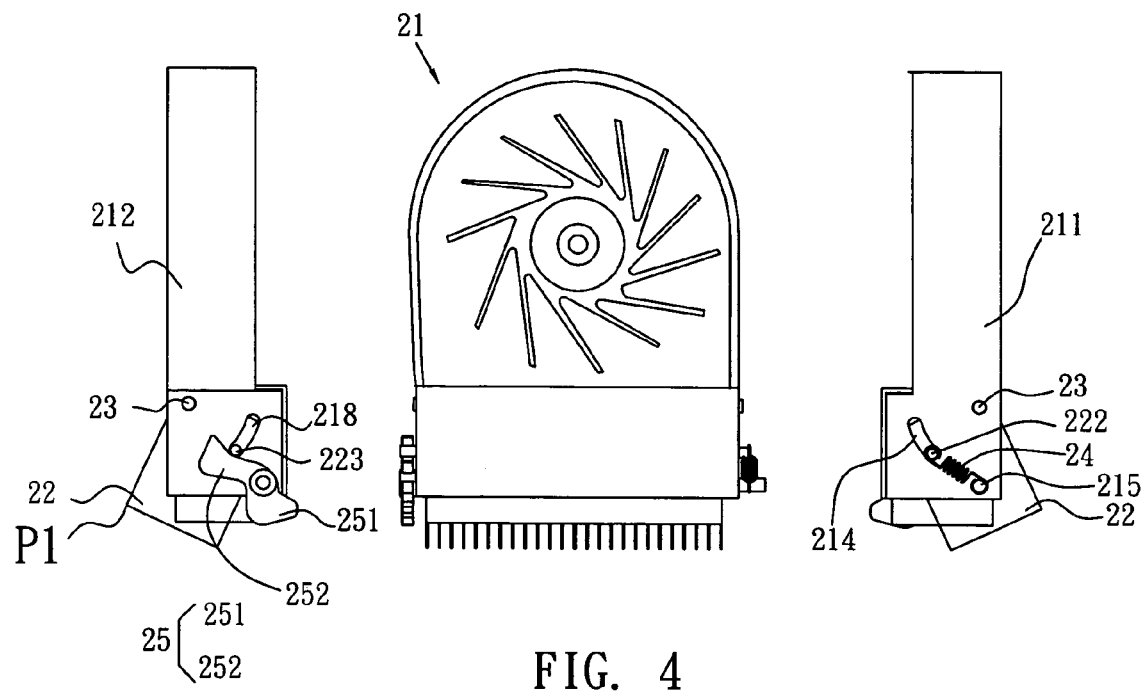
FIG. 4 is a schematic illustration including a top view and two side views showing that the first heat dissipating device of the invention is located at a first position P1.

Firstly, please refer to FIGS. 2 to 4 to illustrate a heat sink assembly with rotatable fins according to the embodiment of the invention. In this embodiment, a notebook computer equipped with a heat sink assembly having rotatable fins will be described as an example. Of course, the heat sink assembly of the invention also can be equipped in other products.

Referring to FIG. 2, a heat sink assembly 20 with rotatable fins includes a housing 21, a first heat dissipating device 22, a rod 23, an elastic member 24 and a lever 25.

Referring to FIG. 3, the housing 21 has a first sidewall 211 and a second sidewall 212 opposite to the first sidewall 211. The first sidewall 211 has a first hole 213, a first sliding hole 214 and a stop portion 215. The second sidewall 212 has a second hole 217 and a second sliding hole 218.

Referring to FIG. 2 again, in the current embodiment, the housing 21 further has a first opening 219 through which a flowing air stream can be produced by a fan 30 in the housing 21, such that the cold air flows into the housing 21 from the first opening 219 for dissipating heat.

In addition, the first heat dissipating device 22 is located in the housing 21. In this embodiment, the outlet is formed between the first sidewall 211 and the second sidewall 212 of the housing 21, and the first heat dissipating device 22 is disposed at the outlet.

Figure 5:
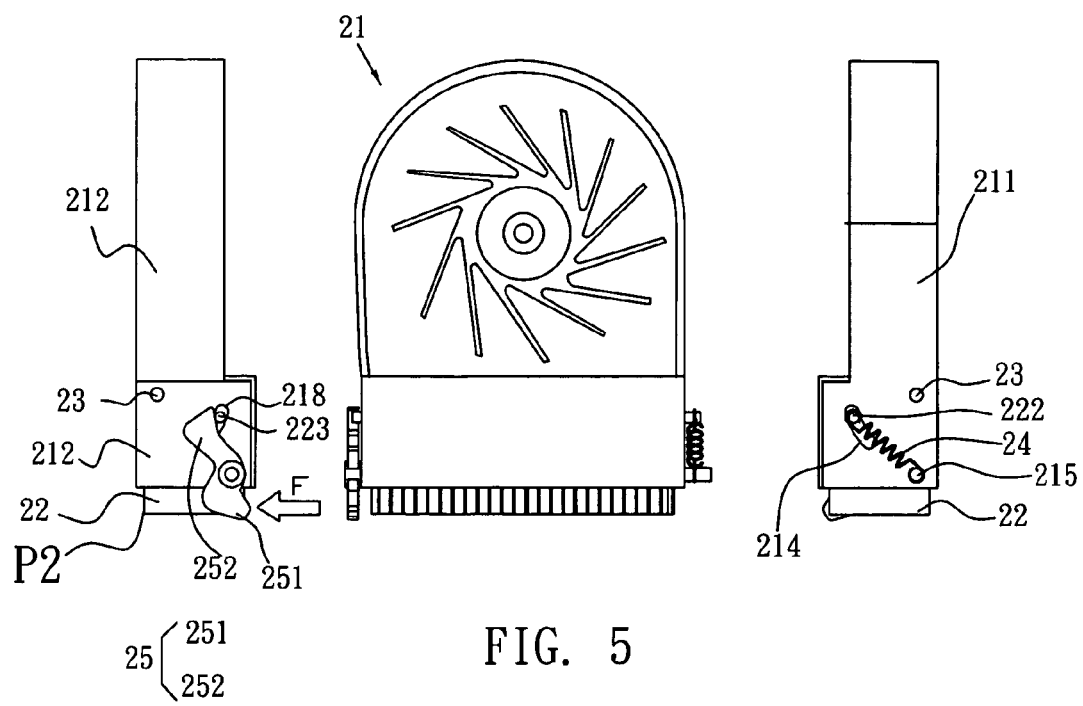
FIG. 5 is a schematic illustration including a top view and two side views showing that the first heat dissipating device of the invention is located at a second position P2.

Referring to FIGS. 3 to 5, the first heat dissipating device 22 has at least one third hole 221, a first protrusion 222 and a second protrusion 223. The first protrusion 222 slides in the first sliding hole 214, and the second protrusion 223 slides in the second sliding hole 218. The first protrusion 222 and the second protrusion 223 cause the first heat dissipating device 22 to rotate between a first position P1 and a second position P2. In this embodiment, the first heat dissipating device 22 has a plurality of first fins 224 arranged in parallel.

The rod 23 passes through the first hole 213, the second hole 217 and the third hole 221 such that the first heat dissipating device 22 is disposed in the housing 21 and rests against a base 210 of the housing. The first heat dissipating device 22 rotates between the first position P1 and the second position P2 with the rod 23 of being a rotating center. When the first heat dissipating device 22 is at the first position P1, a portion of the first heat dissipating device 22 is exposed from the housing 21. So, the heat dissipation space may be enlarged, and the heat dissipation efficiency may be enhanced. When the first heat dissipating device 22 is at the second position P2, most of the first heat dissipating device 22 is located in the housing 21.

The heat sink assembly 20 of the embodiment may further include a second heat dissipating device 26, which has a plurality of second fins 261 arranged in parallel and a plurality of fourth holes 262. The rod 23 passes through the first hole 213, the second hole 217, the third hole 221 and the fourth holes 262 such that a plurality of first fins 224 and a plurality of second fins 261 are arranged in an alternative manner.

As shown in FIG. 2, a first end 241 of the elastic member 24 connects with the stop portion 215. In this embodiment, the stop portion 215 is a post, and the first end 241 of the elastic member 24 is fixed to the stop portion 215.

A second end 242 of the elastic member 24 connects with the first protrusion 222 and provides elasticity for the first protrusion 222 to move the first heat dissipating device 22 back to the first position P1.

As shown in FIGS. 4 and 5, the lever 25 is pivoted on an external side of the second sidewall 212, and the lever 25 moves with the second protrusion 223.

In this embodiment, the lever 25 further includes a first side 251 and a second side 252. When an external force F is applied to press down the first side 251, the second side 252 pushes the second protrusion 223 to make the second protrusion 223 rotate the first heat dissipating device 22 to the second position P2 and the first heat dissipating device 22 is also back to the housing 21.

When the external force F disappears, the elasticity of the elastic member 24 pulls the first protrusion 222 such that the first protrusion 222 moves the first heat dissipating device 22 back to the first position P1 and the first heat dissipating device 22 is exposed from the housing 21. Thus, the heat dissipation space may be enlarged, and the heat dissipation efficiency of the assembly can be enhanced.

Please refer to FIGS. 2 to 6 to illustrate an electrical apparatus according to the embodiment of the invention.

Figure 6:
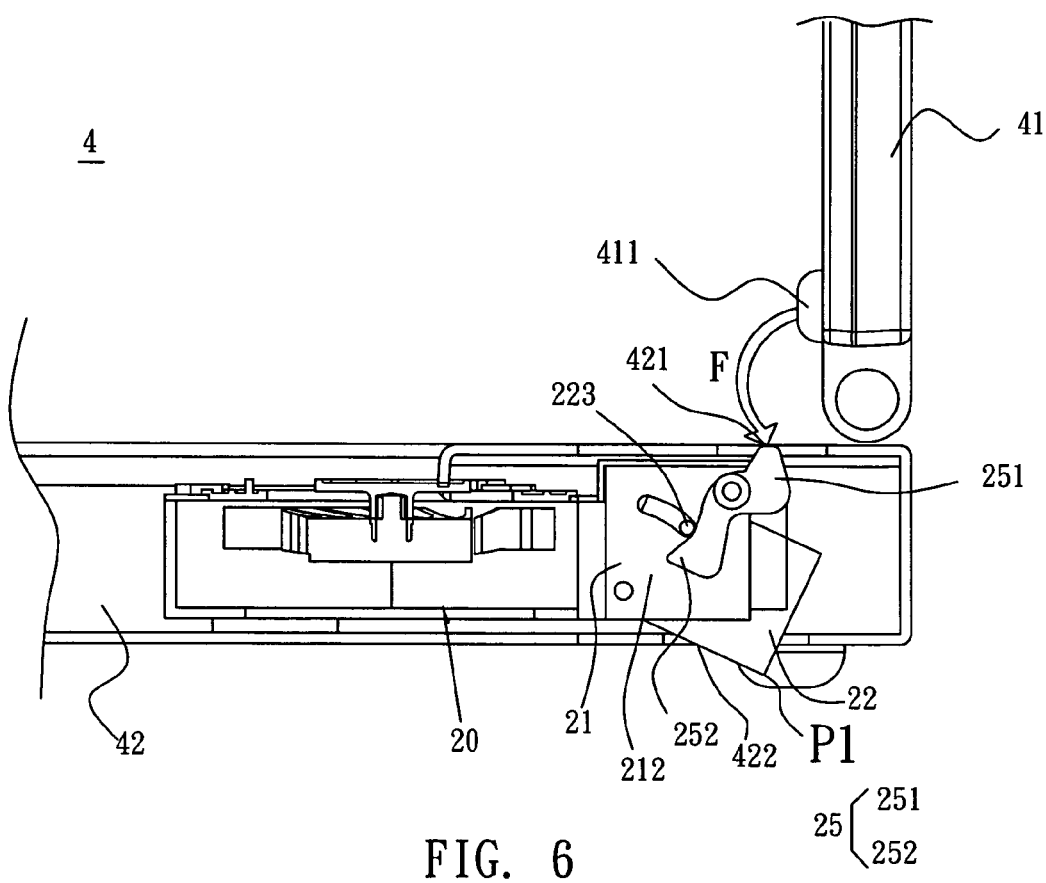
FIG. 6 is a perspective view through a side surface of the electrical apparatus of the invention, wherein the first heat dissipating device is located at the first position P1.

Referring to FIG. 6, an electrical apparatus 4 includes a first casing 41, a second casing 42 and a heat sink assembly 20. In the embodiment, a notebook computer equipped with the heat sink assembly 20 having rotatable fins will be described as an example. Of course, the electrical apparatus 4 of the invention should not be limited in the notebook computer.

The first casing 41 is pivotally mounted to and opposite to the second casing 42. Taking the notebook computer as an example, the first casing 41 may be a liquid crystal display and the second casing 42 may be a computer host.

With reference to FIGS. 2 and 6, the heat dissipating assembly 20 is accommodated in the second casing 42, and includes a housing 21, a first heat dissipating device 22, a rod 23, an elastic member 24 and a lever 25. In the embodiment, the heat dissipating assembly 20 is located in the notebook computer. It may further connect with a heat dissipating pipe for dissipating heat.

Referring to FIG. 3, the housing 21 has a first sidewall 211 and a second sidewall 212 opposite to the first sidewall 211. The first sidewall 211 has a first hole 213, a first sliding hole 214 and a stop portion 215. The second sidewall 212 has a second hole 217 and a second sliding hole 218.

Referring to FIG. 2 again, in the current embodiment, the housing 21 further has a first opening 219 through which a flowing air stream can be produced by a fan 30 in the housing 21, such that the cold air flows into the housing 21 from the first opening 219 for dissipating heat.

In addition, the first heat dissipating device 22 is located in the housing 21. In this embodiment, the outlet is formed between the first sidewall 211 and the second sidewall 212 of the housing 21, and the first heat dissipating device 22 is disposed at the outlet.

Referring to FIGS. 3 to 5, the first heat dissipating device 22 has at least one third hole 221, a first protrusion 222 and a second protrusion 223. The first protrusion 222 slides in the first sliding hole 214, and the second protrusion 223 slides in the second sliding hole 218. The first protrusion 222 and the second protrusion 223 cause the first heat dissipating device 22 to rotate between a first position P1 and a second position P2. In this embodiment, the first heat dissipating device 22 has a plurality of first fins 224 arranged in parallel.

The rod 23 passes through the first hole 213, the second hole 217 and the third hole 221 such that the first heat dissipating device 22 is disposed in the housing 21 and rests against a base 210 of the housing. The first heat dissipating device 22 rotates between the first position P1 and the second position P2 with the rod 23 of being a rotating center. When the first heat dissipating device 22 is at the first position P1, a portion of the first heat dissipating device 22 is exposed from the housing 21. So, the heat dissipation space may be enlarged, and the heat dissipation efficiency may be correspondingly enhanced. When the first heat dissipating device 22 is at the second position P2, most of the first heat dissipating device 22 is located in the housing 21.

The heat sink assembly 20 of the embodiment may further include a second heat dissipating device 26, which has a plurality of second fins 261 arranged in parallel and a plurality of fourth holes 262. The rod 23 passes through the first hole 213, the second hole 217, the third hole 221 and the fourth holes 262 such that a plurality of first fins 224 and a plurality of second fins 261 are arranged in an alternative manner.

As shown in FIG. 2, a first end 241 of the elastic member 24 connects with the stop portion 215. In this embodiment, the stop portion 215 is a post, and the first end 241 of the elastic member 24 is fixed to the stop portion 215.

A second end 242 of the elastic member 24 connects with the first protrusion 222 and provides elasticity for the first protrusion 222 to move the first heat dissipating device 22 back to the first position P1.

Figure 7:
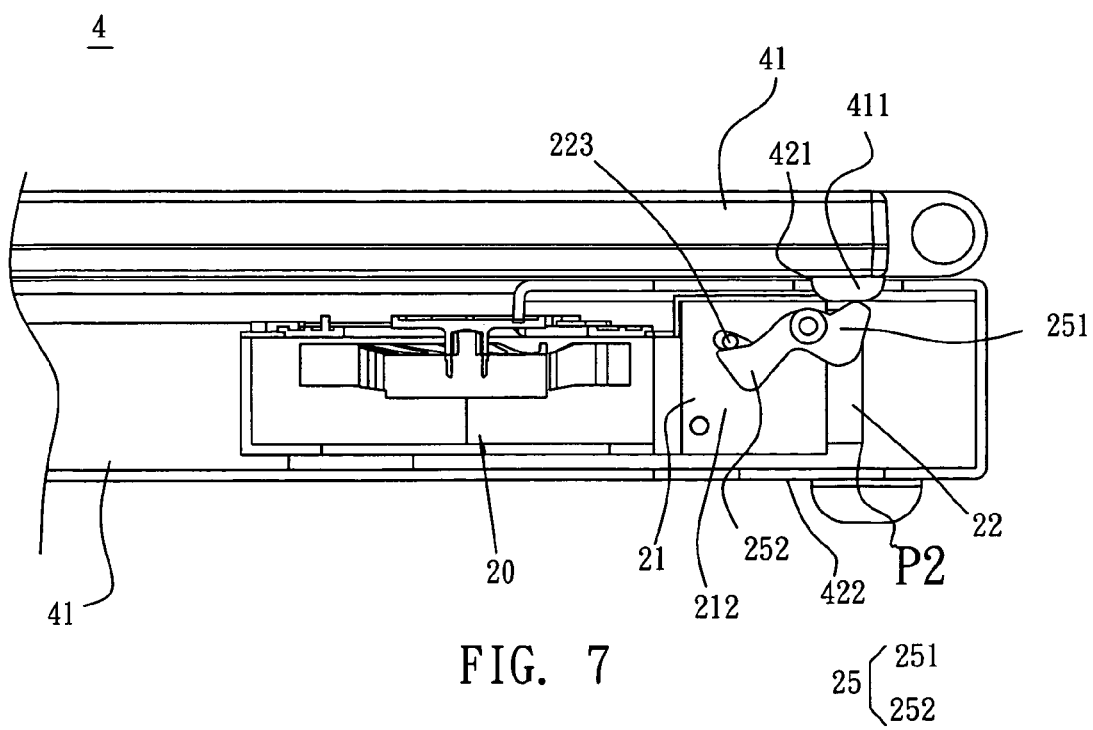
FIG. 7 is a perspective view through another side surface of the electrical apparatus of the invention, wherein the first heat dissipating device is located at the second position P2.

As shown in FIGS. 6 and 7, the lever 25 is pivoted on an external side of the second sidewall 212, and the lever 25 moves with the second protrusion 223.

In the current embodiment, the lever 25 further includes a first side 251 and a second side 252. The first casing 41 further has a third protrusion 411 corresponding to the first side 251 of the lever 25. In addition, the second casing 42 further has a second opening 421 and a third opening 422. The first side 251 of the lever 25 is adjacent to the second opening 421. When the first heat dissipating device 22 is at the first position P1, a portion of the first heat dissipating device 22 is exposed from the third opening 422.

As shown in FIG. 7, when an external force F is applied to press down the first side 251, the second side 252 pushes the second protrusion 223 such that the second protrusion 223 cause the first heat dissipating device 22 to rotate to the second position P2 and the first heat dissipating device 22 is also back to the housing 21. The external force F can be produced by the third protrusion 411 when the first casing 41 is pressed down to the second casing 42.

When the external force F disappears (e.g., the first casing 41 and the second casing 42 are opened for operations), the third protrusion 411 does not press against the lever 25. So, the elasticity of the elastic member 24 pulls the first protrusion 222 such that the first protrusion 222 moves the first heat dissipating device 22 back to the first position P1 and the first heat dissipating device 22 is exposed from the housing 21. Thus, the heat dissipation space may be enlarged and the heat dissipation efficiency of the overall assembly can be enhanced.

In summary, the heat sink assembly with rotatable fins and the electrical apparatus using this heat sink assembly according to the invention have a rotatable heat dissipating device. Compared to the prior art the heat sink assembly and the electrical apparatus including the rotatable heat dissipating device can enlarge the heat dissipation space of the heat dissipating device, enhance the heat dissipation efficiency of the heat sink assembly, effectively lower the temperature of the electrical apparatus, prevent the electrical apparatus from being overheated owing to the poor heat dissipation effect, and thus ensure the quality of the electrical apparatus. In addition, the rotatable heat dissipating device of the invention cannot be rotated to enlarge the heat dissipation space until the first casing and the second casing are opened. When the electrical apparatus is not used, the first casing and the second casing cover and close each other. In this case, the rotatable heat dissipating device is not exposed from the electrical apparatus, which does not interfere the user's convenience in carrying the electrical apparatus. Furthermore, the rotatable heat dissipating device is free from being collided, and the broken condition of the rotatable heat dissipating device can be avoided.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat sink assembly with rotatable fins, comprising:
  a housing, which has a first sidewall and a second sidewall opposite to the first sidewall, wherein the first sidewall has a first hole, a first sliding hole and a stop portion, and the second sidewall has a second hole and a second sliding hole;
  a first heat dissipating device, which is located in the housing, wherein the first heat dissipating device has at least one third hole, a first protrusion and a second protrusion, the first protrusion slides in the first sliding hole, the second protrusion slides in the second sliding hole, and the first protrusion and the second protrusion cause the first heat dissipating device to rotate between a first position and a second position;
  a rod, which passes through the first hole, the second hole and the third hole, wherein the first heat dissipating device rotates between the first position and the second position with the rod of being a rotating center;

an elastic member, which has a first end connecting with the stop portion and a second end connecting with the first protrusion, wherein the elastic member provides an elasticity for the first protrusion to move the first heat dissipating device back to the first position; and a lever, which is pivoted on an external side of the second sidewall, wherein the lever moves with the second protrusion.

2. The heat sink assembly according to claim 1, wherein the housing further comprises a first opening, a fan covers over the first opening, and the fan produces a flowing air stream in the housing.

3. The heat sink assembly according to claim 1, wherein the stop portion is a post, and the first end of the elastic member is fixed to the stop portion.

4. The heat sink assembly according to claim 1, wherein the first heat dissipating device has a plurality of first fins arranged in parallel.

5. The heat sink assembly according to claim 1, wherein the lever further comprises a first side and a second side, and the second side pushes the second protrusion to make the second protrusion rotate the first heat dissipating device to the second position when an external force is applied to press down the first side.

6. The heat sink assembly according to claim 5, wherein when the external force disappears, the elasticity of the elastic member pulls the first protrusion such that the first protrusion moves the first heat dissipating device back to the first position.

7. The heat sink assembly according to claim 1, further comprising:
a second heat dissipating device, which has a plurality of fourth holes, wherein the rod passes through the first hole, the second hole, the third hole and the fourth holes.

8. The heat sink assembly according to claim 7, wherein the second heat dissipating device has a plurality of second fins arranged in parallel.

9. The heat sink assembly according to claim 8, wherein the first fins and the second fins are arranged in an alternative manner.

10. An electrical apparatus, comprising:
a first casing;
a second casing, which is correspondingly pivoted on the first casing; and
a heat sink assembly, which is accommodated in the second casing and comprises:
a housing, which has a first sidewall and a second sidewall opposite to the first sidewall, wherein the first sidewall has a first hole, a first sliding hole and a stop portion, and the second sidewall has a second hole and a second sliding hole,
a first heat dissipating device, which is located in the housing, wherein the first heat dissipating device has at least one third hole, a first protrusion and a second protrusion, the first protrusion slides in the first sliding hole, the second protrusion slides in the second sliding hole, and the first protrusion and the second protrusion cause the first heat dissipating device to rotate between a first position and a second position,
a rod, which passes through the first hole, the second hole and the third hole, wherein the first heat dissipating device rotates between the first position and the second position with the rod of being a rotating center,
an elastic member, which has a first end connecting with the stop portion and a second end connecting with the first protrusion, wherein the elastic member provides an elasticity for the first protrusion to move the first heat dissipating device back to the first position, and
a lever, which is pivoted on an external side of the second sidewall, wherein the lever moves with the second protrusion.

11. The electrical apparatus according to claim 10, wherein the housing further comprises a first opening, a fan covers over the first opening, and the fan produces a flowing air stream in the housing.

12. The electrical apparatus according to claim 10, wherein the stop portion is a post, and the first end of the elastic member is fixed to the stop portion.

13. The electrical apparatus according to claim 10, wherein the first heat dissipating device has a plurality of first fins arranged in parallel.

14. The electrical apparatus according to claim 10, wherein the lever further comprises a first side and a second side, and the second side pushes the second protrusion to make the second protrusion rotate the first heat dissipating device to the second position when an external force is applied to press down the first side.

15. The electrical apparatus according to claim 14, wherein when the external force disappears, the elasticity of the elastic member pulls the first protrusion such that the first protrusion moves the first heat dissipating device back to the first position.

16. The electrical apparatus according to claim 10, wherein the first casing further comprises a third protrusion, and the third protrusion is opposite to the first side of the lever.

17. The electrical apparatus according to claim 10, wherein the second casing further comprises a second opening and a third opening, the first side of the lever is adjacent to the second opening, and when the first heat dissipating device is located in the first position, the a part of the first heat dissipating device is exposed from the third opening.

* * * * *